United States Patent [19]

Ogura

[11] Patent Number: 5,818,754
[45] Date of Patent: Oct. 6, 1998

[54] NONVOLATILE MEMORY HAVING DATA STORING AREA AND ATTRIBUTE DATA AREA FOR STORING ATTRIBUTE DATA OF DATA STORING AREA

[75] Inventor: Naoyuki Ogura, Tokyo, Japan

[73] Assignee: Nec Corporation, Tokyo, Japan

[21] Appl. No.: 773,900

[22] Filed: Dec. 27, 1996

[30] Foreign Application Priority Data

Dec. 27, 1996 [JP] Japan ................................ 7-341513

[51] Int. Cl.$^6$ ............................................. G11C 11/34
[52] U.S. Cl. ............................... 365/185.09; 365/185.11; 365/185.29
[58] Field of Search .................... 365/185.09, 185.11, 365/185.29

[56] References Cited

U.S. PATENT DOCUMENTS

| 5,210,716 | 5/1993 | Takada | 365/200 |
| 5,268,870 | 12/1993 | Harari | 365/218 |
| 5,297,103 | 3/1994 | Higuchi | 365/230.03 |
| 5,546,402 | 8/1996 | Niijima et al. | 371/10.2 |
| 5,594,689 | 1/1997 | Kato | 365/185.22 |

FOREIGN PATENT DOCUMENTS 5-189981  7/1993  Japan .

OTHER PUBLICATIONS

"Gist of Technology in Coding Error Correction", Nippon Kogyo Gijutsu Center Co., Ltd., pp. 109–142.

Primary Examiner—David C. Nelms
Assistant Examiner—Hien Nguyen
Attorney, Agent, or Firm—Foley & Lardner

[57] ABSTRACT

A memory has a plurality of word lines WL1–8, a plurality of bit lines BL1–512 and BLa1–32, a plurality of memory cells C1–512 and Ca1–32, each of memory cells C1–512 and Ca1–32 are connected between selected one of said word lines WL1–8 and selected one of said bit lines BL1–512 and BLa1–32, said plurality of memory cells C1–512 and Ca1–32 connected to said selected one of said word lines WL1–8 are divided into a first group memory cells C1–512 and a second group memory cells Ca1–32, said first group memory cells C1–512 are provided for storing data and said second group memory cells Ca1–32 are provided for storing attribute data of said first group memory cells C1–512.

22 Claims, 16 Drawing Sheets

FIG.6

| | | | SC1 | SC2(SELECTED) | | | |
|---|---|---|---|---|---|---|---|
| C1 | C2 | C3 | ------------------- | C256 | Ca1 | ------ | Ca16 |
| C257 | C258 | C259 | ------------------- | C512 | Ca17 | ------ | Ca32 |
| C1 | C2 | C3 | ------------------- | C256 | Ca1 | ------ | Ca16 |
| C257 | C258 | C259 | ------------------- | C512 | Ca17 | ------ | Ca32 |
| ⋮ | ⋮ | ⋮ | | ⋮ | ⋮ | | ⋮ |
| C1 | C2 | C3 | ------------------- | C256 | Ca1 | ------ | Ca16 |
| C257 | C258 | C259 | ------------------- | C512 | Ca17 | ------ | Ca32 |

| SC1a | | SC3a | | | SC8a |
|---|---|---|---|---|---|
| C1 | C1 | C1 | ---------- | | C1 |
| C2 | C2 | C2 | ---------- | | C2 |
| ~~C3~~ | ~~C3~~ | ~~C3~~ | ---------- | | ~~C3~~ |
| ⋮ | ⋮ | ⋮ | | | ⋮ |
| C512 | C512 | C512 | ---------- | | C512 |
| Ca1 | Ca1 | Ca1 | ---------- | | Ca1 |
| ⋮ | ⋮ | ⋮ | | | ⋮ |
| Ca32 | Ca32 | Ca32 | ---------- | | Ca32 |

SC2a(SELECTED)   1a

FIG.11

| SC1a | | SC2a(SELECTED) | | | SC8a | |
|---|---|---|---|---|---|---|
| C1 | C257 | C1 | C257 | ---------- | C1 | C257 |
| C2 | C258 | C2 | C258 | ---------- | C2 | C258 |
| ~~C3~~ | ~~C259~~ | ~~C3~~ | ~~C259~~ | ---------- | C3 | ~~C259~~ |
| ⋮ | ⋮ | ⋮ | ⋮ | | ⋮ | ⋮ |
| C256 | C512 | C256 | C512 | ---------- | C256 | C512 |
| Ca1 | Ca17 | Ca1 | Ca17 | ---------- | Ca1 | Ca17 |
| ⋮ | ⋮ | ⋮ | ⋮ | | ⋮ | ⋮ |
| Ca16 | Ca32 | Ca16 | Ca32 | ---------- | Ca16 | Ca32 |

| C1 | C2 | C3 | ---------------- | C31 | C32 |
|---|---|---|---|---|---|
| C33 | C34 | C35 | ---------------- | C63 | C64 |
| C65 | C66 | C67 | ---------------- | C95 | C96 |
| ⋮ | ⋮ | ⋮ | | ⋮ | ⋮ |
| C449 | C450 | C451 | ---------------- | C479 | C480 |
| C481 | C482 | C483 | ---------------- | C511 | C512 |

| C1 | C2 | C3 | ---------------- | C31 | C32 |
|---|---|---|---|---|---|
| C33 | | | ---------------- | | C64 |
| C65 | | | ---------------- | | C96 |
| ⋮ | ⋮ | ⋮ | | | ⋮ |
| C449 | | | ---------------- | | C480 |
| C481 | | | ---------------- | | C512 |

22a ATTRIBUTE MEMORY

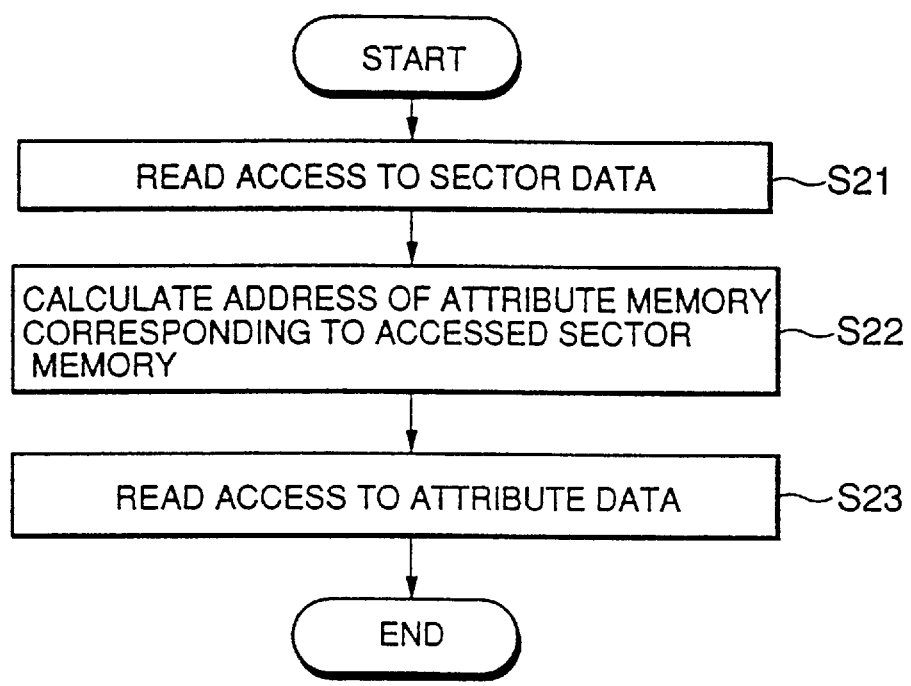

NONVOLATILE MEMORY HAVING DATA STORING AREA AND ATTRIBUTE DATA AREA FOR STORING ATTRIBUTE DATA OF DATA STORING AREA

BACKGROUND OF THE INVENTION

1. Field of the Invention

The present invention relates to a nonvolatile memory, and particularly to a nonvolatile memory having a data storing area and an attribute data area for storing attribute data of the data storing area.

2. Description of the Related Art

In recent years, a nonvolatile semiconductor storage (a nonvolatile memory), particularly an external memory of a computer using a batch erasable type electrical erasable and programmable read only memory (EEPROM) has been beginning to appear. Especially, application of a batch erasable type EEPROM is beginning to be expected in an external memory of a small-sized portable computer, for example, an IC memory card or the like, since the device is characterized in nonvolatileness, power conservation, impact resistance, reduction in size and weight and the like. Japanese Patent Laid-open No. Hei 5-189981 discloses a conventional example of a batch erasable type EEPROM suitable to this field.

Hereinbelow an explanation will be given of a conventional nonvolatile semiconductor storage of this kind in reference to the drawings (refer to Japanese Patent Laid-open No. Hei 5-189981). FIG. 13 is a block diagram showing an example of a conventional nonvolatile semiconductor storage.

A nonvolatile semiconductor storage $10x$ is integrated on a single chip and the inner portion thereof is constituted by a column block decoder $12x$, a row block decoder $13x$ and a memory block array $11x$ comprising 16 unit memory blocks MB11$x$–MB44$x$ arranged in a matrix of 4 rows×4 columns. Each of the unit memory blocks MB11$x$–MB44$x$ is provided with a storage capacity of 512 bytes and each unit memory block is constituted by a plurality (512×8 pieces) of nonvolatile memory cells. The row block decoder $13x$ selects one row among the first row MB11$x$–MB14$x$ through the fourth row (MB41$x$–MB44$x$) in accordance with address signals A12 and A11 of the higher 2 bits of 13 bits of address signals A12–A0 supplied from the outside. The column block decoder $12x$ selects one column among the first column (MB11$x$, MB21$x$, MB31$x$, MB41$x$) through the fourth column (MB14$x$, MB24$x$, MB34$x$, MB44$x$) in accordance with a third and a fourth address signal A10 and A9 from higher orders of the address signals of 13 bits supplied from the outside. The unit memory block that is to be accessed is selected and designated by the column block decoder $12x$ and the row block decoder $13x$.

All of the unit memory blocks are provided with the same basic constitution and each of the unit memory blocks can be written, read and erased independently from the other unit memory blocks.

In the selected and designated unit memory block, memory cells of 1 byte in 512 bytes are selected by the address signals A8 through A0 at lower 9 bits of the address signals A12 through A0 of 13 bits.

FIG. 14 is a block diagram of an IC memory card using the nonvolatile semiconductor storage $10x$.

The IC memory card is provided with a plurality of nonvolatile semiconductor storage of a batch erasable type $10_{x-1}$ to $10_{x-n}$ a control circuit $20x$ and an interface connector $30x$. The nonvolatile semiconductor storage $10_{x-1}$ to $10_{x-n}$ are constituted by erasable unit blocks of 512 bytes as in the storage illustrated by FIG. 13. The interface connector $30x$ inputs and outputs an address signal AD, a data signal DT, a control signal CNT1 and various power supply voltages of Vcc, Vpp, Vgnd and the like, to and from a computer system, not illustrated, using the IC memory card.

The control circuit $20x$ controls selection of the nonvolatile semiconductor storage $10_{x-1}$ to $10_{x-n}$, reading operation, writing operation, erasing operation and the like, with respect to a selected nonvolatile semiconductor storage in accordance with a control signal inputted from a computer system, not illustrated, via the interface connector $30x$. Further, the control circuit $20x$ is provided with an attribute memory 22 and an error correcting circuit $21x$. The attribute memory 22 is necessary for a computer system, not illustrated, using the IC memory card to store various information (hereinafter, attribute data) for normally using the IC memory card.

The attribute data is classified into sector control information and an error correction code.

In a nonvolatile semiconductor storage of a batch erasable type EEPROM, there is an upper limit for the number of rewritings in view of the device characteristic, and, accordingly, data for controlling the number of rewritings of the sector, data for replacing the address of the sector to that of other sector when the number of rewritings of the sector exceeds the upper limit, data indicating erase situation, and the like, are necessary as the sector control information.

Further, when such a nonvolatile semiconductor storage is applied to an external memory of a computer, the error correcting code (hereinafter, ECC) and the error correcting circuit $21x$ are indispensable for improving writing failure caused by data holding characteristic thereof or the above-described limitation in the number of rewritings, and manufacturing yield.

Furthermore, the minimum unit (hereinafter, sector) of the memory region is generally constituted by bytes of 512 or 512 multiplied by an integer in a current external memory of a computer, which is the reason that the erasable unit block of the conventional example is constituted by 512 bytes.

However, according to an external memory using the nonvolatile semiconductor storage, when one sector is accessed, the attribute data of the sector must be accessed other than data (hereinafter, sector data) in the sector as described above.

Accordingly, when sector data is held nonvolatile the attribute data must also be held nonvolatile.

Next, an explanation will be given of the circuit constitution of 1 bit (1 bit in 8 bits of 1 byte) of each of the unit memory blocks MB11$x$–MB44$x$ of the conventional nonvolatile semiconductor storage $10x$ by using an example of the unit memory block MB11$x$ in reference to FIG. 15.

The unit memory block MB11$x$ is constituted as a component of 1 bit by a row decoder $2x$, a column decoder $3x$, a bit line selecting circuit $4x$, a bias circuit for erasing 5, a bias circuit for writing 6, logical product circuits G1–G3 and a memory cell array $1x$ of the erasable unit block. The memory cell array $1x$ of the erasable unit block is constituted by 512 nonvolatile memory cells C1–C512 respectively provided at intersections of 16 word lines WL1–WL16 and 32 bit lines BL1–BL32. In the conventional example the erasable unit block, the sector data region and the sector are the same.

A sector selecting signal SS is a signal which becomes effective when the unit memory block is selected by the column block decoder $12x$ and the row block decoder $13x$ in FIG. 13.

The row decoder 2x selects one of the 16 word lines WL1–WL16 in accordance with address signals A8–A5 of 4 bits. However, the selecting operation is executed only when the sector selecting signal SS is effective.

Each of the nonvolatile memory cells C1–C512 outputs the storage content to connected bit lines (BL1–BL32) when the connected word line is selected by the row decoder 2x.

The column decoder 3x makes effective one of 32 column decoder output signal lines in accordance with the address signals A4–A0 of 5 bits. However, this operation is executed only when the sector selecting signal SS is effective.

The bit line selecting circuit 4x selects one of the 32 bit lines BL1–BL32 in accordance with the column decoder output signal from the column decoder 3x and outputs data on the selected bit line 28 (D0).

The bias circuit for erasing 5 supplies the memory cell array 1x of the erasing unit block with an erase voltage when the logical product circuit G2 outputs an effective level, that is, both of an erasing signal ER and the sector selecting signal SS are at effective levels. Thereby, all of the memory cells C1–C512 in the cell array 1x become an erased state.

The bias circuit for writing 6 supplies the memory cell array 1x of the erasing unit block with a writing voltage when the logical product circuit G3 outputs an effective level, that is, both of a writing signal WE and the sector selecting signal SS are at effective levels. Thereby, one memory cell designated by the row decoder 2x and the column decoder 3x achieves the writing state.

When such a nonvolatile semiconductor storage 10x is used by integrating it into an external memory of a computer system such as the IC memory card shown by FIG. 14, although the nonvolatile semiconductor storage 10x is provided with the sector data region, it is not provided with an attribute data region and therefore, a nonvolatile memory for attribute data, that is, the attribute memory (22), is needed at the outside thereof. Further, the error correcting circuit (21x) is also necessary and these are provided in the control circuit (20x) as described above.

[Problems that the Invention is to solve]

According to the conventional nonvolatile semiconductor storage 10x, the size of the unit erasable block is rendered in bytes of 512 multiplied by an integer in consideration of access to the sector data. However, there poses the following problems in respect of the access to the attribute data of the sector which is necessarily accompanied in accessing the sector data. Further, there poses the following problems with respect to occurrence of failure or occurrence of error of stored data. An explanation will be given of the problems in reference to the drawings as follows.

FIG. 16 is a memory arrangement diagram for explaining sector data of one sector and a relation between storage situation of attribute data and failure of bit line.

A nonvolatile semiconductor storage is characterized in that the occurrence rate of failure of bit lines is large as well as ageing failure and initial failure.

Referring to FIG. 16, an explanation will be given of a situation of one bit component when sector data of one sector having the length of 512 bytes is stored to each unit memory block (MB13x in this example) and attribute data of the length of 32 bytes is stored to corresponding rows of the attribute memory 22 having a constitution that is the same as that of the unit memory block. Each row designates a word line and each column designates a bit line in FIG. 16. Further, bit line failure is caused at an address designated by slanted lines.

According to FIG. 16, failure of one bit line caused in the unit memory block MB13x is recognized as an error of 16 bits in the sector data. This is caused since the one sector data is divided into 16 word lines.

Here, according to "Gist of technology in coding error correction", Nippon Kogyo Gijutsu Center Co, Ltd., pp109–142, when the circuit scale of 1 bit error correcting circuit is 1, the circuit scale of a circuit for correcting 2-bit error including one error of which error position is already known as in the initial failure, is around 2.

In correcting an error an equation having a degree number the same as an error number in the Galois field must be solved. In the case of 1 bit error, an equation of the first degree must be solved, in the case of 2 bit error, an equation of the second degree must be solved, and in the case of 3 bit error an equation of the third degree must be solved. The circuit scale of 2 bit error correcting circuit and a circuit for correcting error of 3 bits or more in respect of a 1 bit error correcting circuit can be predicted therefrom. The circuit scale of the 2 bit error correcting circuit is about 5–6 times as large as that of the 1 bit error correcting circuit. However, an equation of the third degree or higher must be solved for the circuit for correcting error of 3 bits or more in the correction block length of 512 bits and accordingly, the circuit scale is magnified by several tens of times or more, which is very complicated.

Consider the situation of a case where 16 bit error correcting circuit is provided to relieve as far as an initial failure of one bit line in one erasing unit block thereby promoting the manufacturing yield. In this case, when there causes a failure of one bit line in the attribute memory corresponding to the sector data, an error of a total of 17 bits is caused in view of the total of the sector as illustrated by FIG. 17, which exceeds the capability of the 16 bit error correcting circuit. Therefore, when the attribute data is stored to an erasable unit block separately from that for the sector data, a failure occurrence rate at the two blocks must be considered in the case where an error correcting circuit is designed, which gives rise to an increase in the circuit scale of the error correcting circuit.

The above-described problem is caused since the sector data and the attribute memory are not present in the same unit erasable block. For example, as shown by FIG. 17, in the case where the attribute data a0–a31 are stored in the attribute memory 22a having the constitution the same as that of the single memory block in continuation to the sector data, a single sector is stored by being divided into two unit erasable blocks so far as the unit erasable block is constituted by bytes of 512 multiplied by an integer. Further, for example, when the unit erasable block is constituted by 1024 bytes and the remaining 480 bytes after storing 512 bytes of the sector data and 32 bytes of the attribute data, are not used, the problem can be avoided. However, a new problem of lowering the efficiency of using memory cells arises, which is economically undesirable.

Furthermore, it has another drawback wherein the processing of accessing a sector is complicated as described below.

FIG. 18 is a flow-chart for explaining the operation of read access to a sector stored in a unit memory block.

In the case where the sector data and the attribute data are not in the same unit erasable block as in FIG. 16, read access to the sector data is executed at step S21 and thereafter, at step S22 the address of the attribute data corresponding to the sector data on the attribute memory (C64–C95 in the example of FIG. 16) is calculated or provided by referring to a table and thereafter, read access to the attribute data is executed at step S23. Accordingly, a time period of calculation is required in step S22 and in addition thereto, a time period is required in address switching of each row and therefore, access to the sector at a high speed is difficult.

It is an object of the present invention to provide a nonvolatile semiconductor storage capable of reducing the circuit scale of an error correcting circuit and accelerating the operational speed.

SUMMARY OF THE INVENTION

To achieve the above mentioned object, a memory according to the present invention comprises a plurality of word lines, a plurality of bit lines, and a plurality of memory cells. Each of the memory cells are connected between selected ones of the word lines and selected ones of the bit lines, and the plurality of memory cells connected to the selected ones of the word lines are divided into a first group memory cells and a second group memory cells. The first group of memory cells are provided for storing data and the second group of memory cells are provided for storing attribute data of the first group memory cells.

Further, the present invention includes at least one sector (sector is defined as one word line) where sector data of a first byte number and attribute data of a second byte number corresponding to the sector data, are stored as one set of data in one row (column) or rows (columns), and are arranged, whereby an error correcting circuit in respect of data of one sector can be constituted by a circuit correcting error of one bit or bits. Therefore, a bit line failure and a memory cell failure can be relieved by the error correcting circuit whereby the manufacturing yield is promoted and the manufacturing cost can be reduced. Further, calculation of addresses for accessing to the attribute data is dispensed with, the number of rows (the number of columns) of one sector can significantly be decreased (minimum 1 row, 1 column) and the sector data and the attribute data can continuously be accessed thereby providing an effect by which the operational speed can be accelerated.

BRIEF DESCRIPTION OF THE DRAWINGS

FIG. 6 is a memory arrangement diagram showing a modified example of a data storage situation of a sector in the nonvolatile memory shown in FIG. 1, FIG. 10 is a memory arrangement diagram for explaining a relation between a data storage situation of a sector in a unit memory block shown in FIG. 9 and a word line failure, FIG. 11 is a memory arrangement diagram showing a modified example of the data storage situation of a sector in the unit memory block shown in FIG. 9, FIG. 17 is a memory arrangement diagram showing a modified example of the data storage situation of sector in the unit memory block shown by FIG. 15, and FIG. 18 is a flow-chart for explaining read access operation of the unit memory block shown in FIG. 15.

DETAILED DESCRIPTION OF THE PREFERRED EMBODIMENTS

An explanation will be given of embodiments of the present invention in reference to the drawings.

Figure 1:
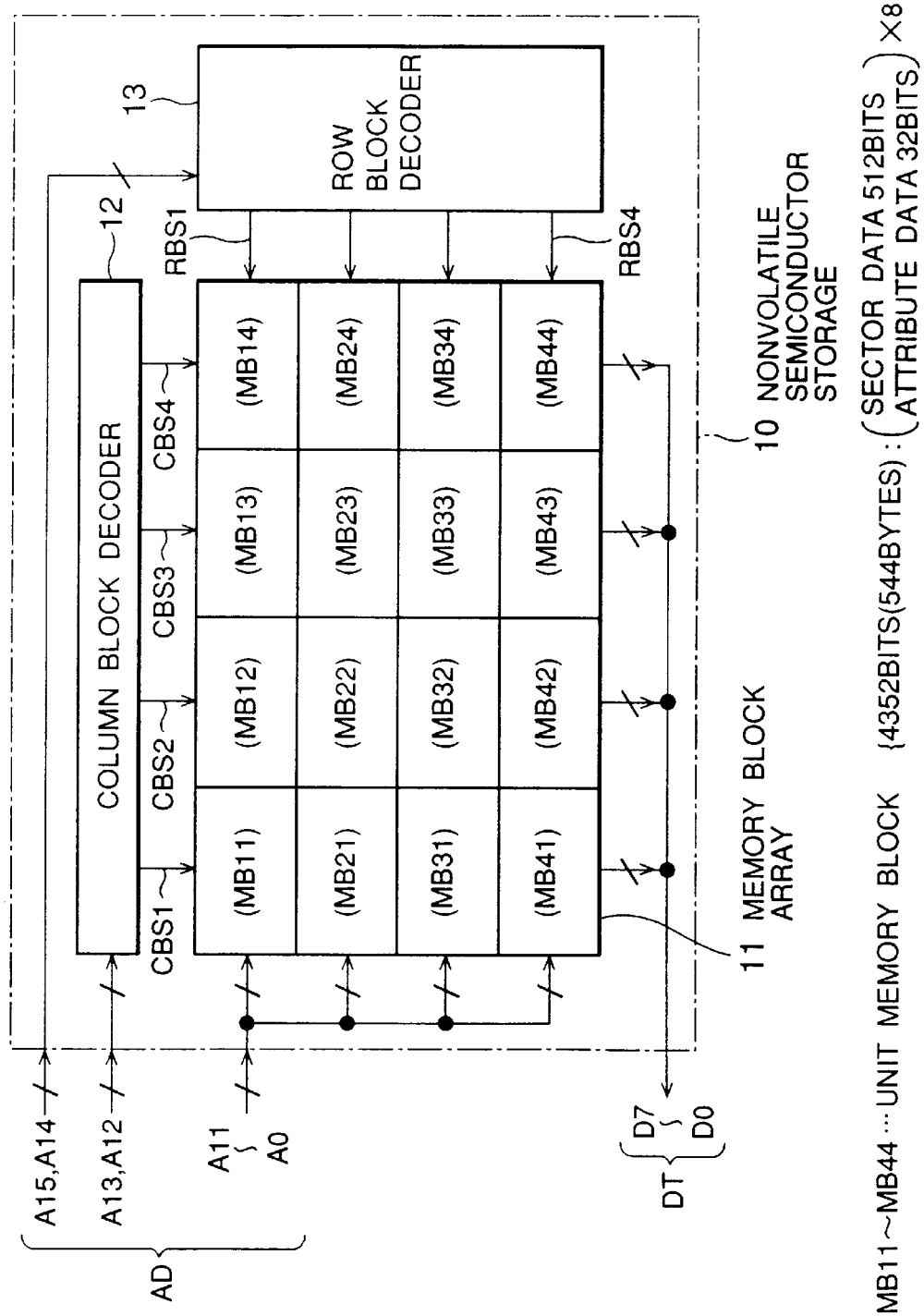
FIG. 1 is a block diagram of a nonvolatile semiconductor storage according to a first embodiment of the present invention.

FIG. 1 is a block diagram showing Embodiment 1 of the present invention.

A nonvolatile semiconductor storage 10 of a first embodiment is provided with a memory block array 11 having unit memory blocks MB11–MB44 in 4 rows and 4 columns, each of which is provided with a memory cell array including 8 rows of sectors, each row having a plurality of memory cells for storing one set of sector data of 512 bytes (B) and one set of attribute data of 32 bytes corresponding to the sector data as one unit, which reads the sector data and the attribute data stored in a predetermined sector in accordance with a first address signal (A11–A0) in a selected state, and becomes one erasing unit in erasing data. The semiconductor storage is provided with a column block decoder 12 and a row block decoder 13 of a unit memory block selecting circuit which makes a predetermined unit memory block of the memory block array 11 in a selected state in accordance with a second address signal (A15–A12).

According to the nonvolatile semiconductor storage 10, the row block decoder 13 selects one row among a first row block (MB11, MB12, MB13, MB14) through a fourth row block (MB41, MB42, MB43, MB44) in accordance with the address signals A15 and A14 which are the higher 2 bits of the address signals A15 through A0 of 16 bits supplied from the outside. The column block decoder 12 selects one column among a first column block (MB11, MB21, MB31, MB41) through a fourth column block (MB14, MB24, MB34, MB44) in accordance with a third bit A13 and a fourth bit A12 from the highest order of the address signals among the address signals A15–A0. The unit memory block to be accessed is selected and designated by the column block decoder 12 and the row block decoder 13 (selected state).

All of the unit memory blocks (MB11–MB44) are provided with the same basic constitution and each of the unit memory blocks can be written, read and erased independently from each of the other unit memory blocks.

In the selected and designated unit memory block, a memory cell of 1 byte among 4352 bytes is selected by the lower 12 bits of A11–A0 among the address signals A15–A0 and a sector data selecting signal SDS supplied from the outside.

Next, an explanation will be given of a specific circuit constitution of 1 bit component with respect to each of the unit memory blocks MB11–MB44 of the nonvolatile semiconductor storage 10 by taking an example of the unit memory block MB11 in reference to FIG. 2.

The unit memory block MB11 is provided with: a memory cell array 1 including 8 sectors SC1–SC8 in each of which memory cells C1–C512 and Ca1–Ca32 for storing one unit of sector data and attribute data are arranged, a plurality of word lines WL1 through WL8 provided in correspondence with the respective rows of the sectors SC1–SC8 of the memory cell array 1, a plurality of bit lines BL1–BL512 and BLa1–BLa32 provided in correspondence with the respective columns of all the memory cells included in the memory cell array 1, a row decoder 2 for selecting memory cells in correspondence with a word line by selecting one of the plurality of word lines WL1–WL8 in accordance with the address signal A11–A9 (row address signal) when the block selecting signal BS is at an effective level, a column decoder 3 and a bit line selecting circuit 4 for selecting one of the plurality of bit lines BL1–BL512 and BLa1–BLa32 in accordance with the address signal A8–A0 (column address signal) and the sector data selecting signal SDS when the block selecting signal BS is at an effective level and reading data of a memory cell corresponding to the bit line and selected by the row decoder 2, a bias circuit for erasing 5 for erasing data of all the memory cells of the memory cell array 1 by supplying the memory cell array 1 with a bias voltage for erasing when the block selecting signal BS is at an effective level in erasing data (ER active), a bias circuit for writing 6 for writing data by applying a bias voltage for writing to selected memory cells of the memory cell array 1 when the block selecting signal BS is at an effective level in writing data (WE active), and a logical product circuit G1 for outputting the block selecting signal BS of the effective level when both of a block column selecting signal CBS1 from the column block decoder 12 and a block row selecting signal RBS1 from the row block decoder 13 are at an effective level.

The sector data is stored in the memory cells C1–C512 of the respective sectors SC1–SC8 and a sector data region 1S is constituted by these memory cells. Further, the attribute data is stored in the memory cells Ca1–Ca32 of each of the sectors SC1–SC8 and an attribute data region 1A is constituted by these memory cells.

The row decoder selects one of the 8 word lines WL1–WL8 in accordance with the address signal A11–A9 of 3 bits. Incidentally, the selecting operation is executed only when the block selecting signal BS is at an effective level.

The memory cells C1–512 and Ca1–Ca32 output the storage content (data) to connected (corresponding) bit lines when the connected (corresponding) word lines are selected by the row decoder 2.

The column decoder 3 makes one of 512 column decoder output signals for selecting the sector data in an effective level in accordance with the address signals A8–A0 of 9 bits when the sector data selecting signal SDS is at an effective level and makes one of row decoder output signals of 32 bits for selecting the attribute data in an effective level when the sector data selecting signal SDS is at an ineffective level.

Incidentally, this operation is executed only when the block selecting signal BS is at an effective level.

The bit line selecting circuit 4 selects one of the bit lines BL1–BL512 and BLa1–BLa32 in accordance with a total of the 544 column decoder output signals from the column decoder 3 and outputs data on the selected bit line. According to the embodiment, addresses corresponding to the bit lines BLa1–BLa32 and addresses corresponding to the bit lines BL1–BL32 are allocated to the same addresses and are switched by the sector data selecting signal SDS, however, they may be allocated to other addresses.

Figure 3:
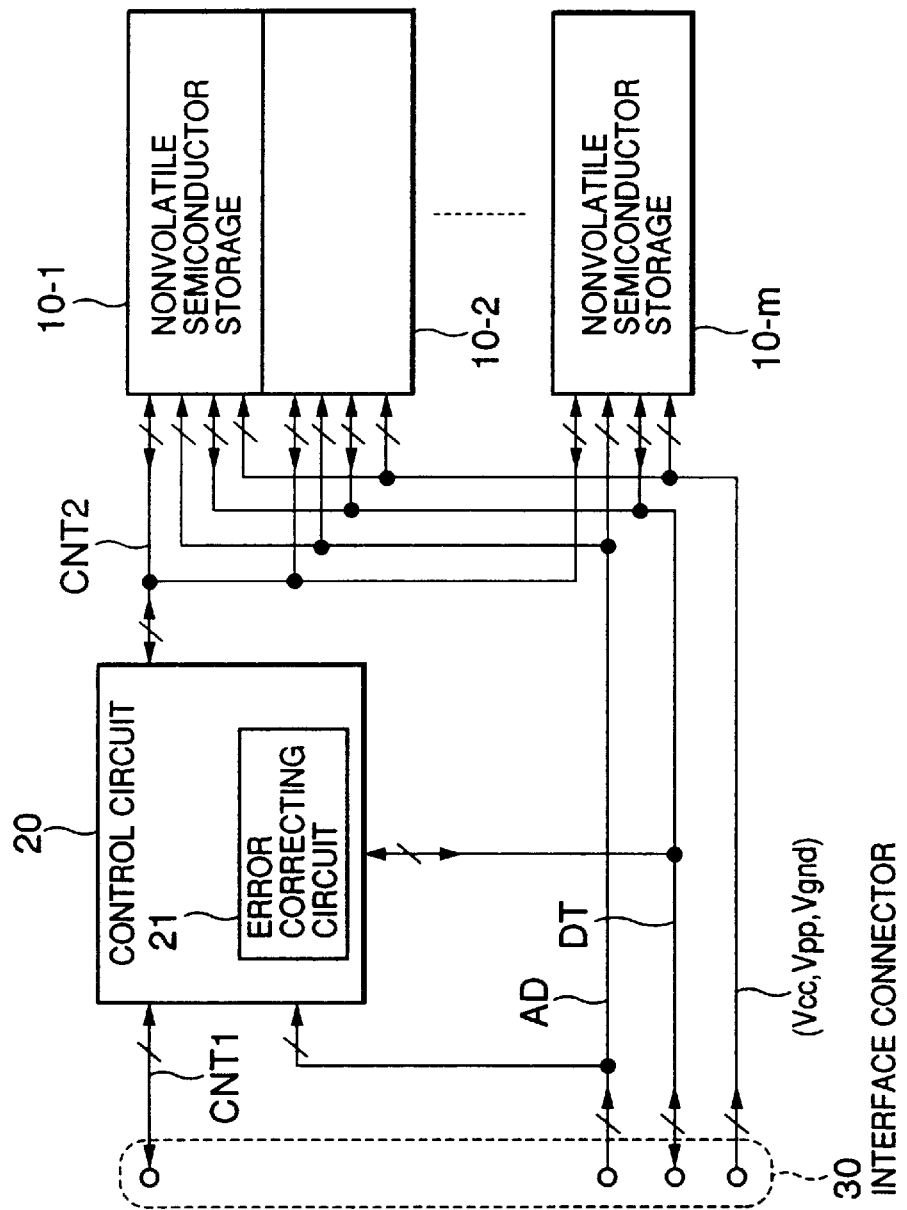
FIG. 3 is a block diagram when the nonvolatile memory shown in FIG. 1 is supplied to an IC memory card as an external memory of a computer system.

FIG. 3 is a block diagram when the nonvolatile semiconductor storage 10 of Embodiment 1 is applied to an IC memory card that is an external memory of a computer system.

The IC memory card is provided with a plurality of nonvolatile semiconductor storage 10-1 to 10-m, a control circuit 20 including an error correcting circuit 21 and an interface connector 30 for connecting to a computer system.

The interface connector 30 inputs and outputs an address signal AD, a data signal DT, a control signal CNT1 and various power supply voltages of Vcc, Vpp and Vgnd and the like to and from a computer system using the IC memory card.

The control circuit 20 controls selection of the nonvolatile semiconductor storage 10-1 to 10-m and reading, writing and erasing operation or the like in respect of the selected nonvolatile semiconductor storage device in accordance with the control signal CNT1 inputted from the computer system through the interface connector 30. Further, the error correction is executed in respect of data read by the error correcting circuit 21 and the data is transmitted to the computer system.

Figure 4:
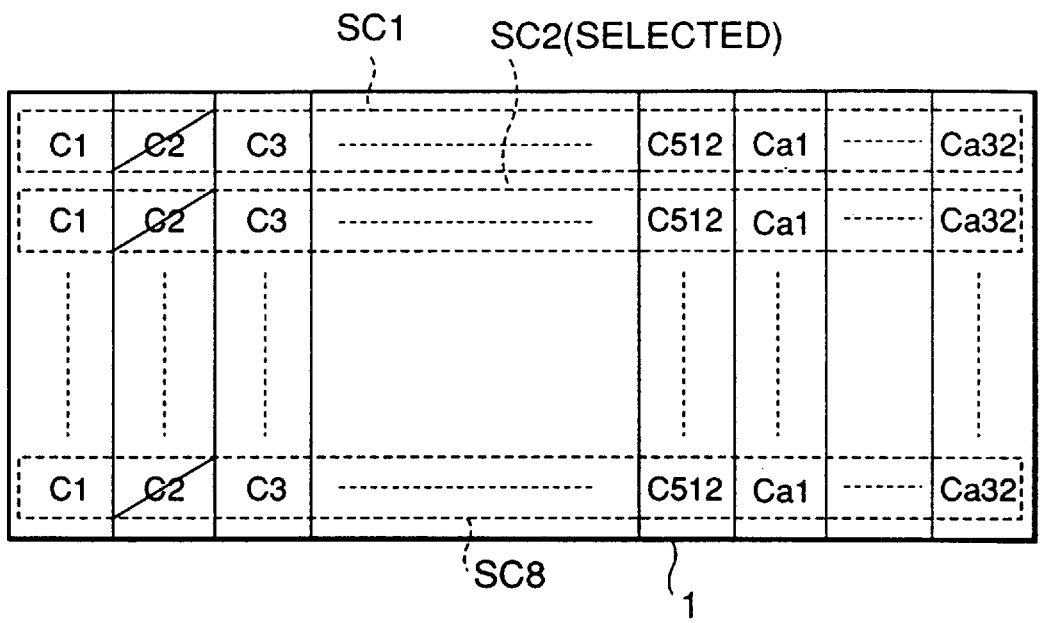
FIG. 4 is a memory arrangement diagram for explaining a relation between a data storage situation of sector in the nonvolatile memory shown in FIG. 1 and a bit line failure.

Next, an explanation will be given of a relation between the data storage situation of sectors and bit line failure of the nonvolatile semiconductor storage 10. FIG. 4 is a memory arrangement diagram for explaining the relation between the data storage situation of the sectors of the nonvolatile semiconductor storage 10 and bit line failure.

Figure 2:
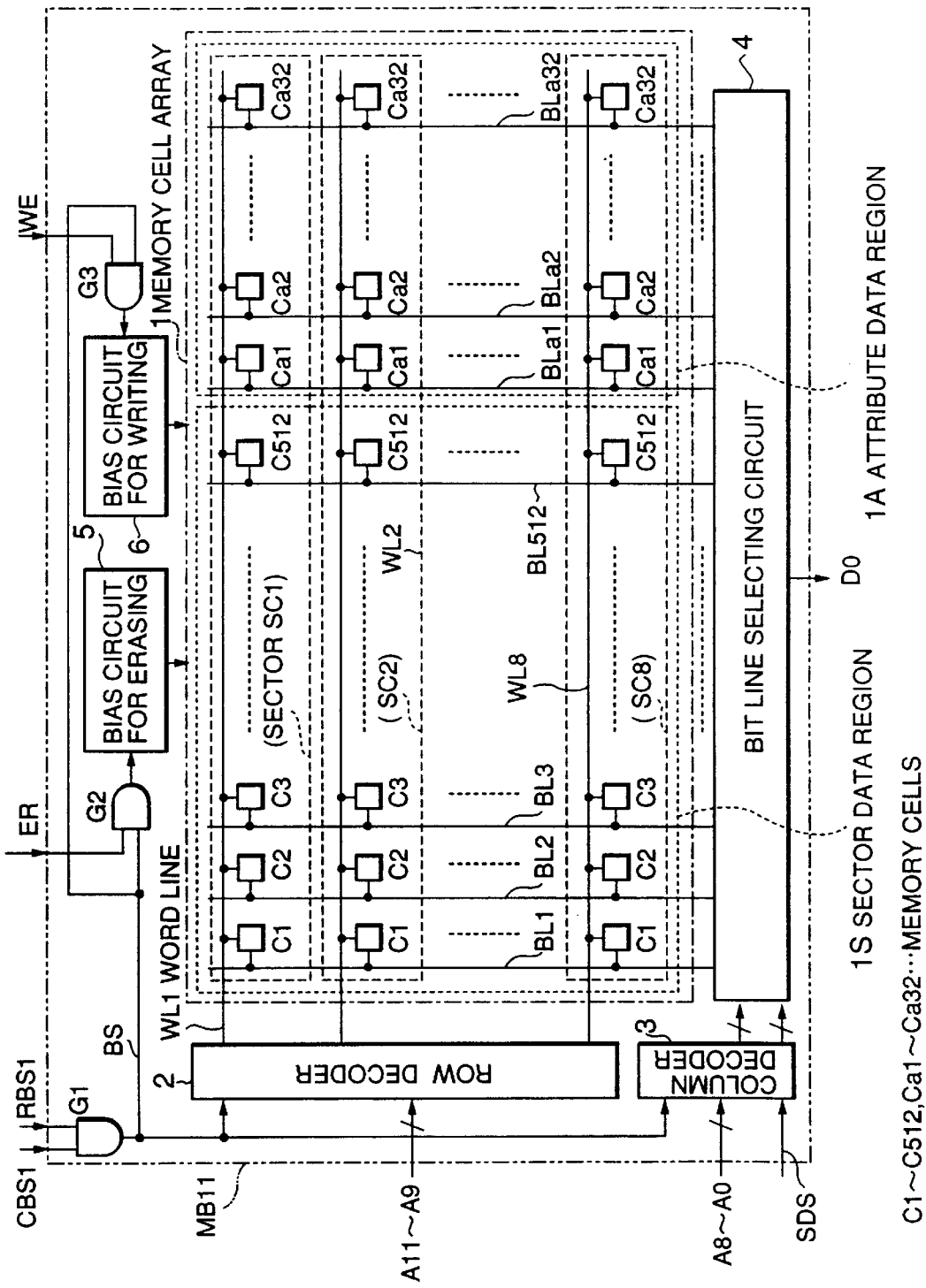
FIG. 2 is a circuit diagram of a unit memory block in the nonvolatile memory illustrated in FIG. 1.

In reference to FIG. 4, an explanation will be given of the situation of 1 bit component (8 bits for 1 byte) when the length of the sector data in one sector is set to 512 bytes and the length of the attribute data is set to 32 bytes wherein each of the sectors is arranged on a single word line as illustrated by FIG. 2. According to FIG. 4 each row represents the word line and each column represents the bit line.

In FIG. 4 the sector data of 512 bits is stored in the memory cells C1–C512 of each of the sectors SC1–SC8 and the attribute data of corresponding 32 bits is stored to the memory cells Ca1–Ca32. Further, a bit line failure occurs at one column (C2) shown with slanted lines.

When one sector (SC2 in FIG. 4) is selected and the data is read, according to the embodiment, it is recognized that an error of 1 bit exists with respect to data of 544 bits (a total of the sector data and the attribute data) and accordingly, the error correcting circuit may be used to relieve the initial failure of 1 bit. According to the conventional example the error correcting circuit for relieving the initial failure of 16 bits or 17 bits is needed even in the case of a failure of a single bit line and therefore, according to the embodiment the circuit scale of the error correcting circuit can be downsized to 1, which is several times smaller (10s-th) of that of the conventional example.

This effect is achieved since the sector data and the attribute data are on the same word line. A failure of 2 bit lines may not be present in a total of the sector as in the conventional case even in the case where one erasing unit block is selected to allow as far as a failure of one bit line on the premise of coping with the failure by the error correcting circuit, since the sector data and the attribute data are in the same erasable unit block. Thereby, the manufacturing yield is promoted and a significant reduction in the manufacturing cost can be expected. Further, even when an error correcting circuit of 2 bits corresponding to one error where the error position is known as in the initial failure and an error of 1 bit such as holding failure etc., is constituted, the circuit scale can be downsized to 1, which is several times smaller (10s-th) of that in the conventional example.

The first embodiment is further provided with an advantage of accelerating the access to the sector.

Figure 5:
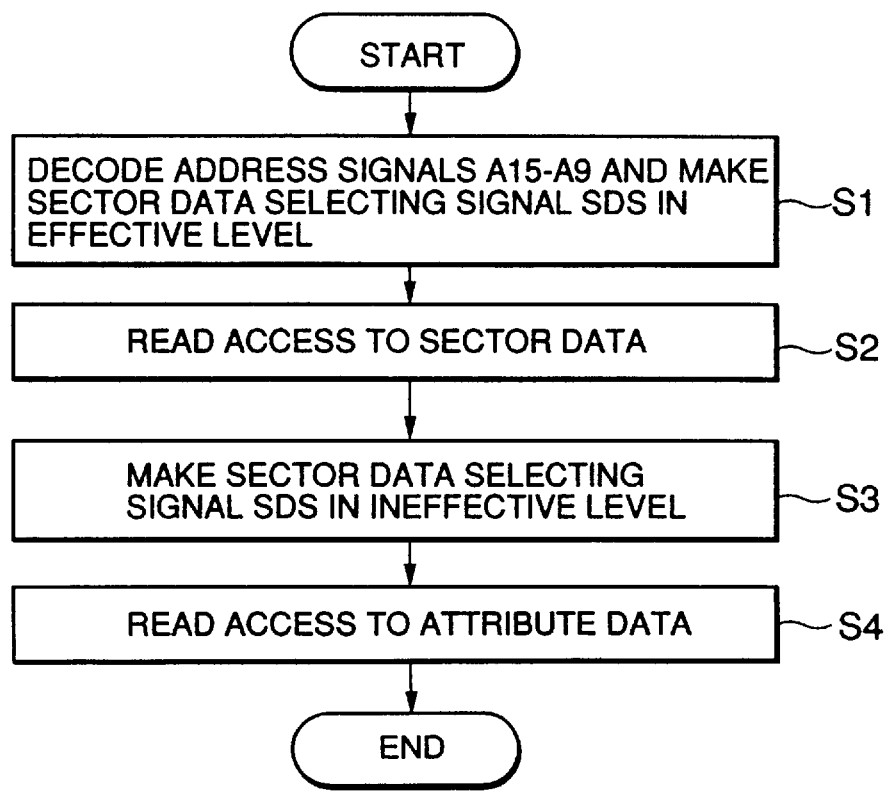
FIG. 5 is a flow-chart for explaining read access operation with respect to a sector in the unit memory block of the nonvolatile memory shown in FIG. 1.

FIG. 5 is a flow-chart showing a read access operation to data of a sector stored in the unit memory block of the first embodiment.

When read access to a sector is started, first, the address signal A15–A9 is decoded and the sector selecting signal SDS is made to stay in an effective level (step S1). Next, the address signals A8–A0 are successively output and read access to the sector data is executed (step S2). To correctly read the sector data the attribute data corresponding to the sector data must be read in continuation thereto. Hence, the sector data selecting signal SDS is made to stay in an ineffective level (step S3) and successively, the address signals A15–A0 are decoded and the attribute data corresponding to the sector data are read (step S4). Here, the addresses of the memory cells Ca1–Ca32, where the attribute data corresponding to the sector data is stored, are the same as the addresses of the memory cells C1–C32 where the sector data are stored as described above. Therefore, it is not necessary to provide the addresses of the attribute data corresponding to the sector data through calculation or table reference as in the conventional example whereby access to the sector can be accelerated by a corresponding amount. Further, according to the conventional example the sector data of one sector is successively selected by the 16 word lines and the corresponding attribute data is selected by the 1 word line successively and therefore, the time period for selecting and switching the word lines is prolonged. However, according to the first embodiment, only one word line is selected and access to the sector can be accelerated by a corresponding amount.

Although one set of the sector data and the attribute data (data of 1 sector) is arranged in correspondence with one word line according to the first embodiment, it is not necessary to limit the number of word lines of one sector to one. The number may be two or more, or small numbers taking into consideration the circuit scale of the error correcting circuit, the operational time period of access to the sector and the like. FIG. 6 illustrates an example where one sector is arranged in correspondence with two word lines (in two rows).

Figure 7:
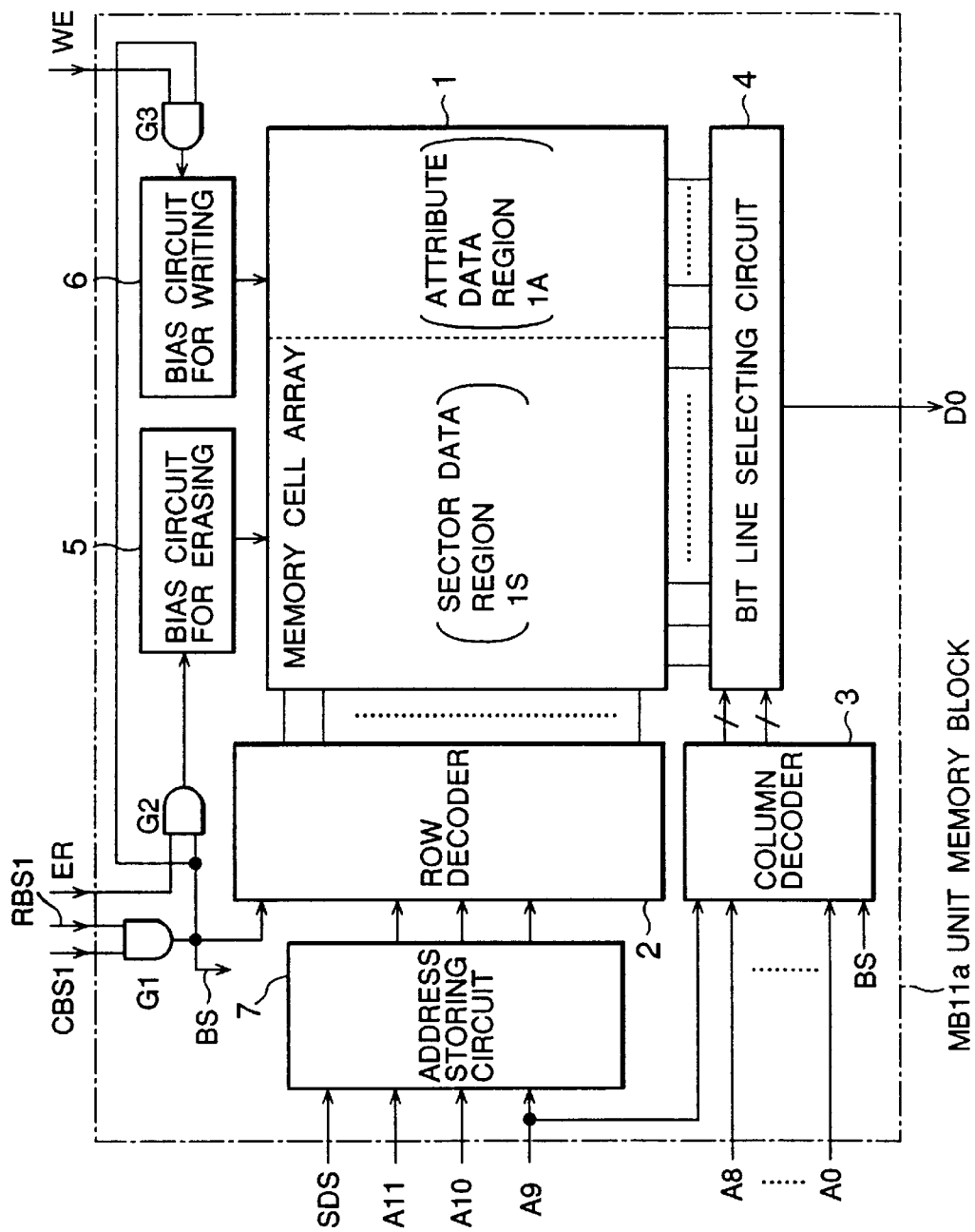
FIG. 7 is a block diagram of a unit memory block according to a second embodiment of the present invention.

FIG. 7 is a block diagram showing unit memory blocks according to the second embodiment of the present invention.

The difference between a unit memory block (MB11) of the first embodiment and the unit memory block (MB11a) of the second embodiment shown by FIG. 2 resides in that, according to the first embodiment, whether the sector data region 1S of the selected data is accessed or the attribute data region 1A is accessed, is determined by the level of the sector data selecting signal SDS, whereas according to the second embodiment, it is determined by the level of the address signal A9. Therefore, according to the second embodiment, an address storing circuit 7 for storing the address signals A11–A9 and for supplying them to the row decoder 2 when the sector data selecting signal SDS is at an effective level, is provided and the address signal A9 is substituted for the sector data selecting signal SDS outputted to the column decoder 3.

Figure 8:
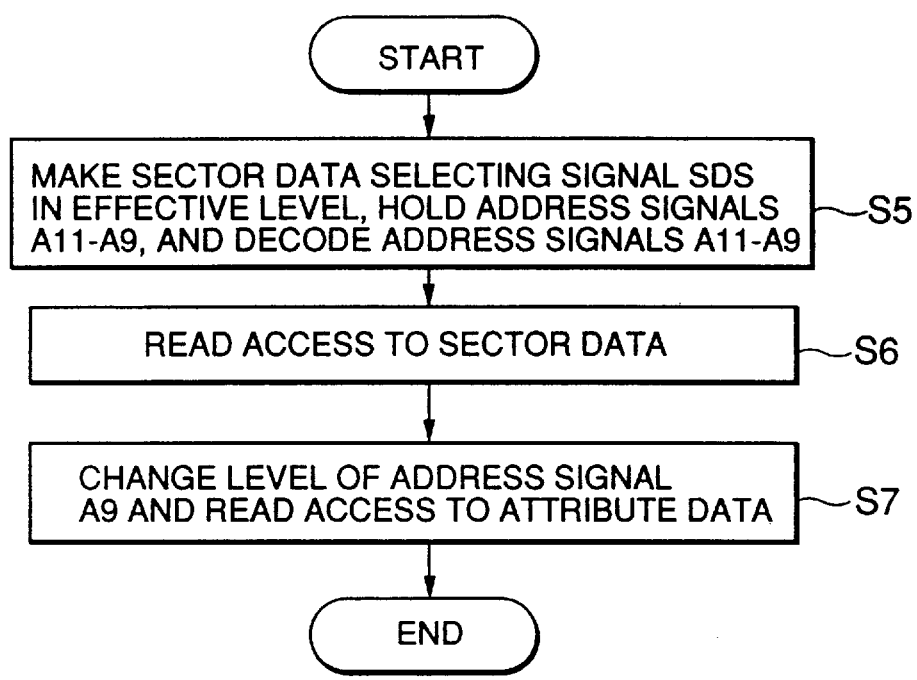
FIG. 8 is a flow-chart for explaining read access operation with respect to a sector in the unit memory block shown in FIG. 7.

Next, an explanation will be given of read access operation with respect to a sector according to the second embodiment. FIG. 8 is a flow-chart for explaining the read access operation with respect to a sector according to the second embodiment.

When the read access with respect to a sector is started, first, the sector data selecting signal SDS is made to stay in an effective level, the address signals A11–A9 are held at the address storing circuit 7 and are supplied to the row decoder 2 and the row decoder 2 decodes the signals and selects one sector (step S5).

Next, the address signal A9 is made to stay in a predetermined level (for example, in compliance with an effective level of the sector data selecting signal SDS) and the read access with respect to the sector data is executed in accordance with the address signals A8–A0 (S6). Successively, the level of the address signal A9 is changed and the access to the attribute data is executed in accordance with the address signals A8–A0 (S7).

According to the second embodiment the addresses of the attribute data can be arranged immediately after the sector data in continuation thereto and therefore, and it is not necessary to provide the addresses of the attribute data corresponding to the sector data through calculation or table reference as in the conventional case, whereby access to a sector can be accelerated. Further, block transfer order of CPU or DMA transfer or the like can be used since the addresses are continuous, thereby providing an advantage whereby the access can further be accelerated. Also, an effect similar to that in the first embodiment is achieved with respect to the error correcting circuit and the like.

Additionally, a single sector can be arranged in rows of a small plural number as in the first embodiment.

Figure 9:
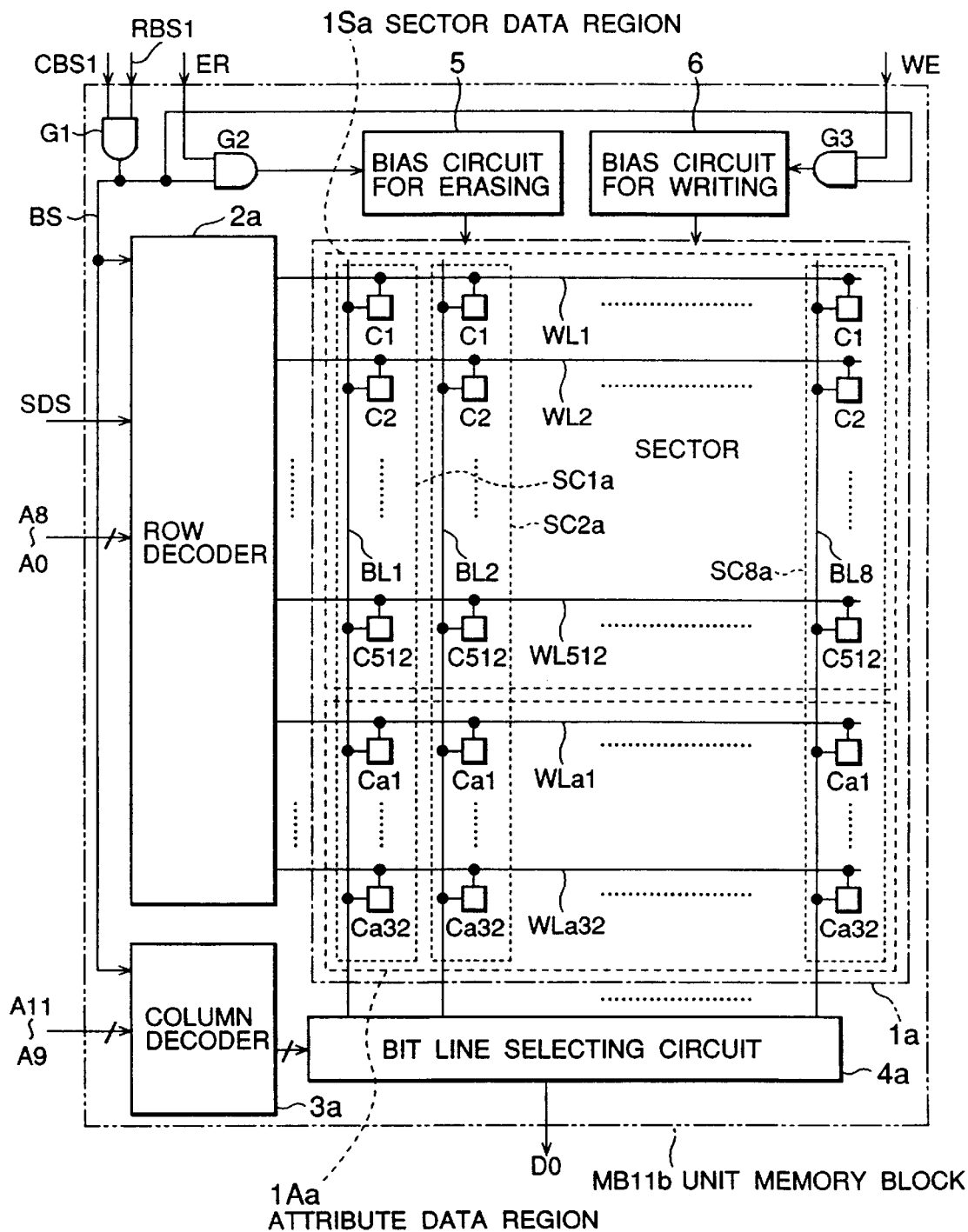
FIG. 9 is a circuit diagram of a unit memory block according to a third embodiment of the present invention.

FIG. 9 is a block diagram showing a unit memory block according to a third embodiment of the present invention.

According to the first embodiment and the second embodiment, the sector data region 1S and the attribute data region 1A of one sector are arranged on the same word line (row). According to the third embodiment, the arrangement is changed such that these regions are arranged on the same bit line (column).

A row decoder 2a makes one of 512 word lines WL1–WL512 stay in an effective level in accordance with the address signals A8–A0 of 9 bits when the sector data selecting signal SDS is at an effective level, and makes one of 32 word lines WLa1–WLa32 stay in an effective level when the sector data selecting signal SDS is at an ineffective level. Incidentally, this operation is executed only when the block selecting signal BS is at an effective level. Although addresses corresponding to the word lines WLa1 through WLa32 and addresses corresponding to the word lines WL1 through WL32 are allocated at the same addresses according to the embodiment, they may be allocated at other addresses.

Memory cells (C1 etc.) of respective lines output storage content to connected (corresponding) bit lines (BL1–BL8) when connected (corresponding) word lines are selected by the row decoder 2a.

A column decoder 3a makes 1 bit among column decoder output signals of 8 bits at a selecting level in accordance with the address signals A11–A9. However, the selecting operation is executed only when the block selecting signal BS is at an effective level.

A bit line selecting circuit 4a selects one of the bit lines BL1–BL8 in accordance with column decoder output signals from the column decoder 3a and outputs data on the selected bit line.

FIG. 10 is a memory arrangement diagram for explaining a relation between the data storage situation of sectors and word line failure of the nonvolatile semiconductor storage according to the third embodiment.

Referring to FIG. 10, an explanation will be given of the situation of one bit component when the length of the sector data of one sector is set to 512 bytes, the length of attribute data is set to 32 bytes, and each sector is arranged on each one bit line (1 column) as illustrated by FIG. 9. In FIG. 10 each row represents a word line and each column represents a bit line.

In FIG. 10 the sector data of 512 bits is stored to the memory cells C1–C512 of each of sectors SC1a–SC8a and corresponding attribute data of 32 bits is stored to the memory cells Ca1–Ca32. Further, word line failure occurs at a row attached with slanted lines.

Now, when one sector (SC2a in FIG. 10) is selected and the data is read, it is recognized that the failure of a single word line occurred in one erasable unit block and is regarded as 1 bit error in each sector. Accordingly, a 1 bit error correcting circuit may be constituted to relieve the initial failure of the single word line and the circuit scale can be rendered 1, or several 10s-th of that in the conventional example.

Further, similar to the first embodiment, the manufacturing cost can be reduced by relieving the initial failure of the word line by the error correcting circuit whereby access to sector can be accelerated.

Although a set of the sector data and the attribute data (data of 1 sector) is arranged in correspondence with a single bit line (in one column), according to the above-described third embodiment, it is not necessary to limit the number of bit lines of one sector to 1, but the number may be 2 or more (in small numbers) taking into consideration the circuit scale of the error correcting circuit, the access operation time period with respect to the sector or the like. An example where one sector is arranged in correspondence with 2 bit lines (in 2 columns), is shown in FIG. 11.

Figure 12:
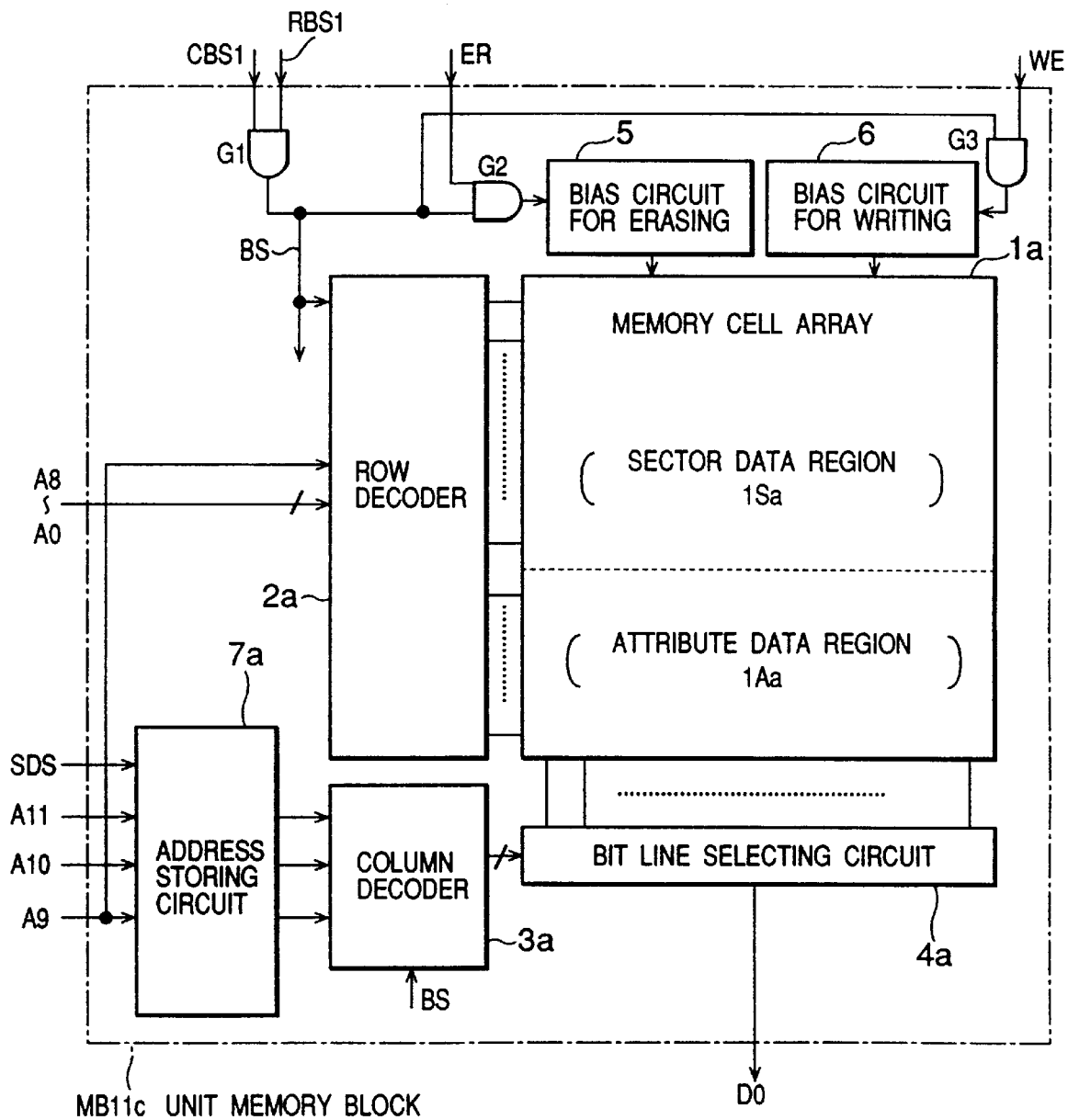
FIG. 12 is a block diagram of a unit memory block according to a fourth embodiment of the present invention.
Figure 13:
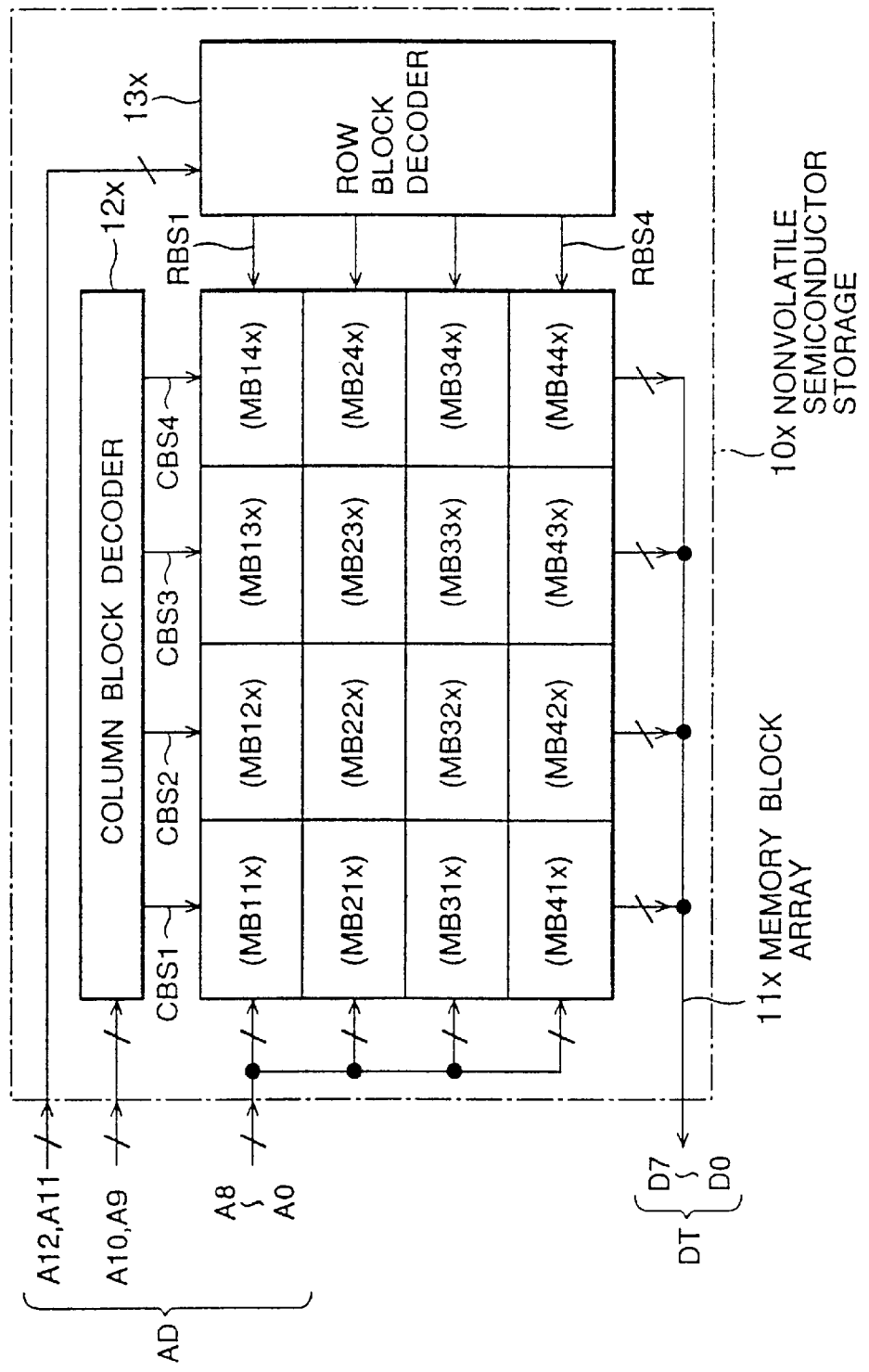
FIG. 13 is a block diagram showing a conventional nonvolatile memory.
Figure 14:
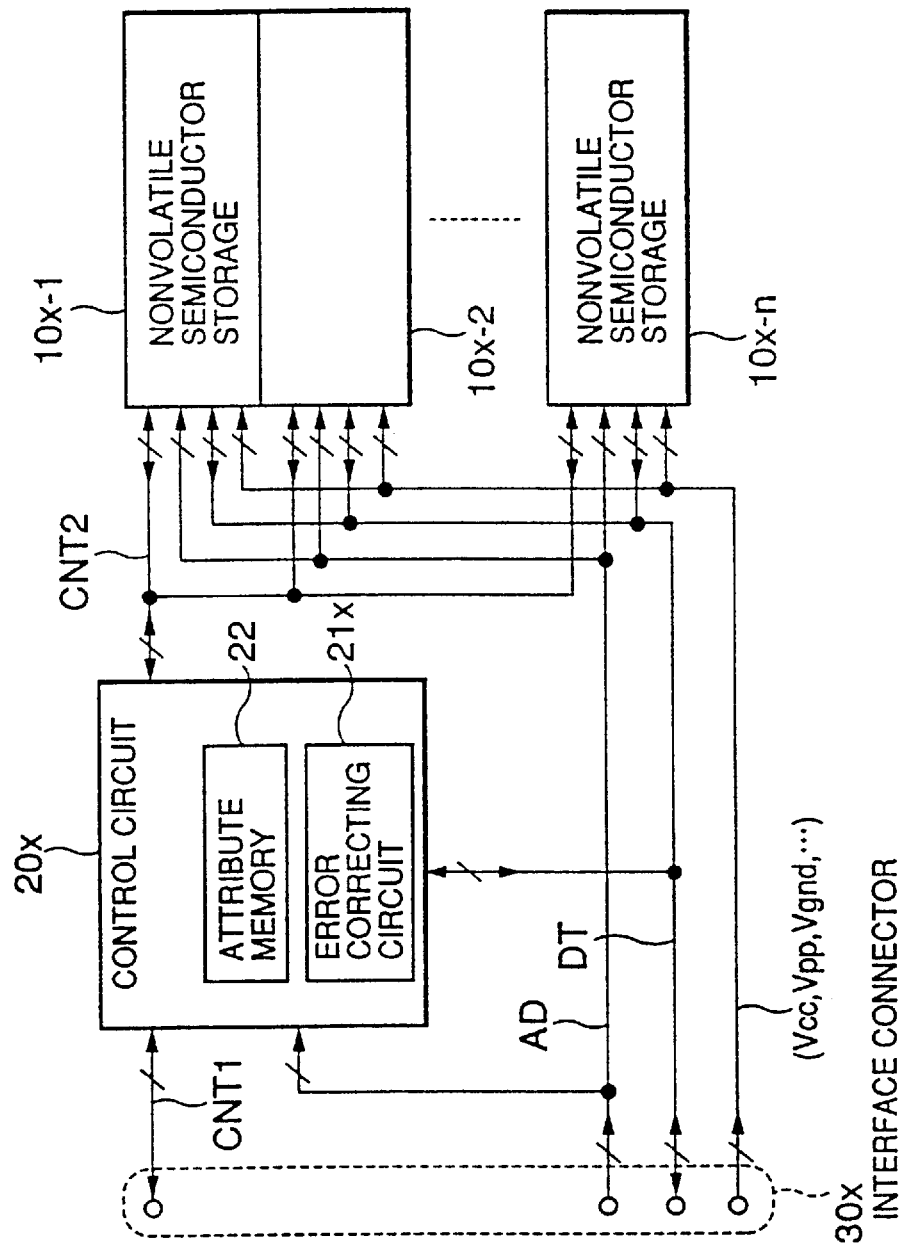
FIG. 14 is a block diagram when the nonvolatile memory shown in FIG. 13 is applied to an IC memory card as an external memory of a computer system.
Figure 15:
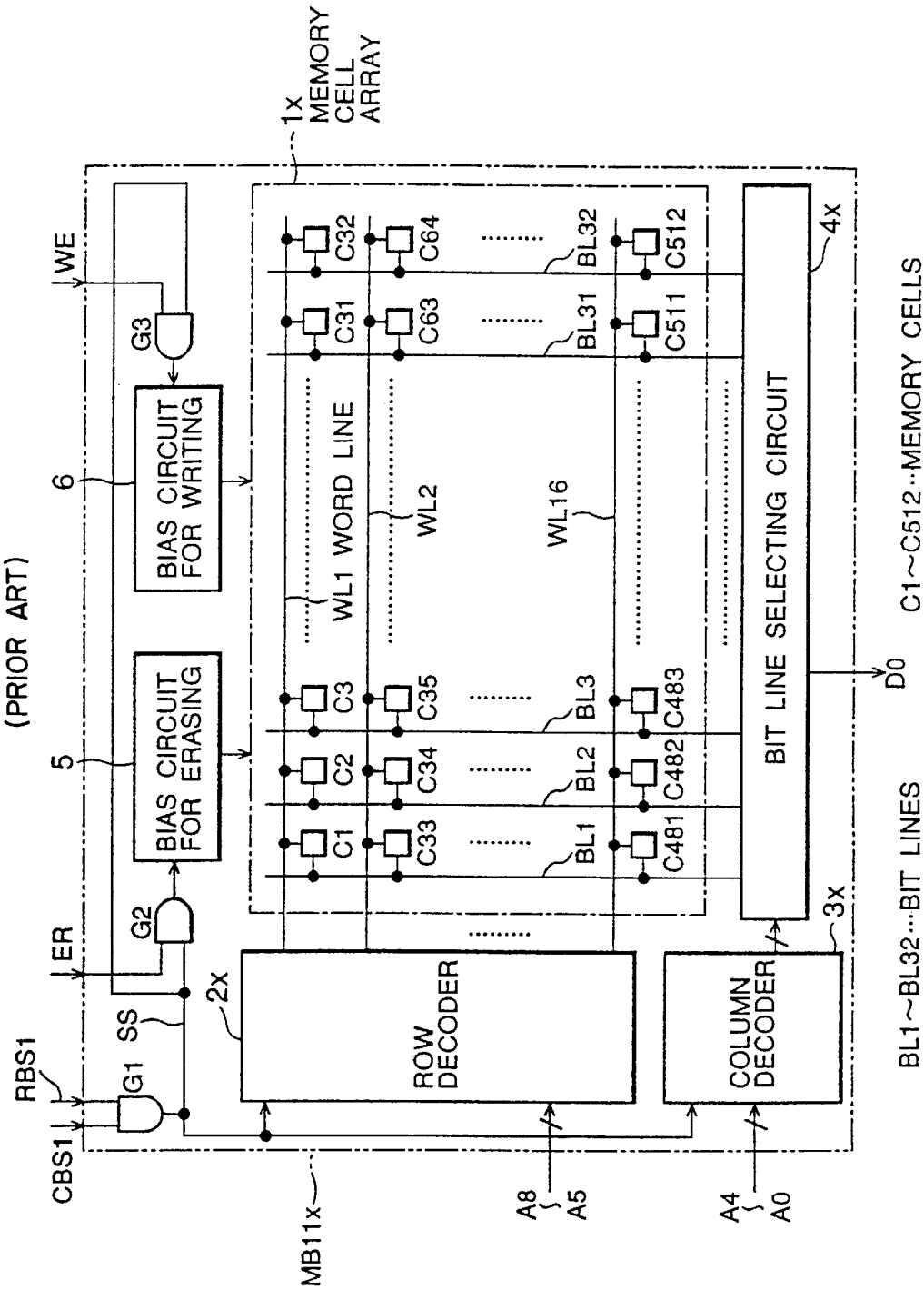
FIG. 15 is a circuit diagram of a unit memory block of the nonvolatile memory shown in FIG. 13.
Figure 16:
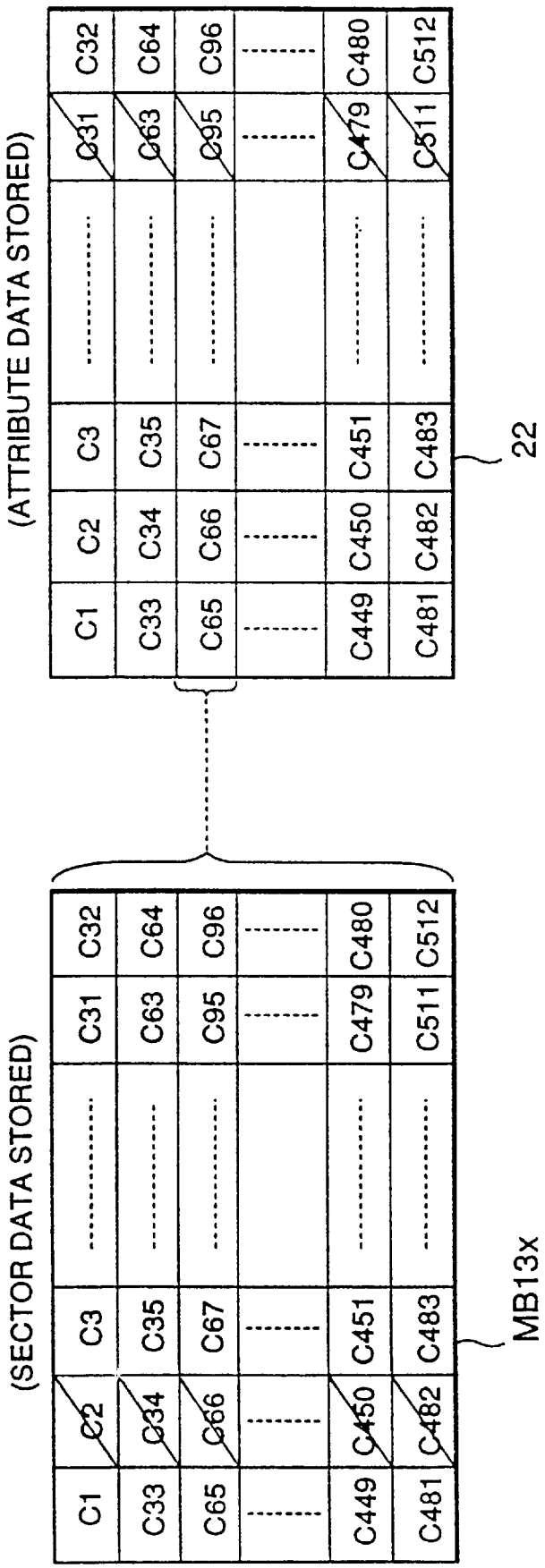
FIG. 16 is a memory arrangement diagram for explaining a relation between a data storage situation of sector in the unit memory block shown by FIG. 15 and a bit line failure.

FIG. 12 is a block diagram showing a unit memory block according to a fourth embodiment of the present invention.

The difference between a unit memory block (MB11c) according to the fourth embodiment and the unit memory block (MB11b) according to the third embodiment, resides in that, according to the third embodiment, whether the sector data region 1Sa of the selected sector is accessed or the attribute data region 1A is accessed, is determined in accordance with the level of the sector data selecting signal SDS, whereas according to the fourth embodiment, it is determined in accordance with the level of the address signal A9. Therefore, according to the fourth embodiment, an address storing circuit 7a for storing the address signals A11–A9 and supplying them to the column decoder 3a when the sector data selecting signal SDS is at an effective level, is provided, and the address signal A9 is substituted for the sector data selecting signal SDS outputted to the row decoder 2a.

The relation between the data storage situation of sector and the bit line failure in the fourth embodiment is the same as that in the third embodiment. Further, the read access operation with respect to a sector stored in the erasable unit block is the same as that in the second embodiment. Therefore, the fourth embodiment is similarly provided with the advantage whereby the access to a sector can be accelerated. Also, the addresses used in accessing to sector can be made continuous and accordingly, they can be used in a block transfer order of a CPU, DMA transfer or the like thereby providing an advantage whereby the access can further be accelerated. Also, an effect similar to those explained in the first embodiment through the third embodiment is provided in respect of the error correcting circuit and the like. Furthermore, a single sector can be arranged in columns of a small plural number.

Additionally, whether data of a single sector is arranged in the row direction as in the above described first embodiment and the second embodiment, or arranged in the column direction as in the third embodiment or the fourth embodiment, may be determined in consideration of the situation of occurrence of failure at bit line or word line or the type (NAND type, NOR type etc.) or the like of the memory cell array.

As has been explained, according to the present invention a predetermined number of unit memory blocks each of which includes at least one of sectors where sector data of a first byte number and attribute data of a second byte number corresponding to the sector data, are stored as one set of data in one row (column) or rows (columns) of a small number, are arranged, whereby an error correcting circuit in respect of data of one sector can be constituted by a circuit correcting error of one bit or bits of a small number. Therefore, the bit line failure or the word line failure can be relieved by the error correcting circuit whereby the manufacturing yield is promoted and the manufacturing cost can be reduced. Further, calculation of addresses for accessing to the attribute data is dispensed with, a number of rows (a number of columns) of one sector can significantly be decreased (minimum 1 row, 1 column) and the sector data and the attribute data can continuously be accessed thereby providing an effect by which the operational speed can be accelerated.

What is claimed is:

1. A memory comprising:
   a plurality of word lines;
   a plurality of bit lines; and
   a plurality of memory cells, wherein each of said memory cells is connected between a selected one of said plurality of word lines and a selected one of said plurality of bit lines, and
   wherein said plurality of memory cells connected to a selected one of said word lines are divided into a first group of memory cells and a second group of memory cells, said first group memory cells being provided for storing data and said second group memory cells being provided for storing attribute data of said first group of memory cells, and wherein said first group of memory cells corresponds to 512 bits.

2. The memory as claimed in claim 1, further comprising an error correction circuit connected to said plurality of word lines to detect and correct an error of at least one of said plurality of memory cells connected to a selected one of said word lines.

3. The memory as claimed in claim 1, further comprising an error correction circuit connected to said plurality of word lines to detect and correct an error of at least one of said plurality of bit lines connected to said word lines via corresponding memory cells.

4. The memory as claimed in claim 1, further comprising an erasing circuit to erase contents of all of said memory cells in response to an erasing signal.

5. A memory as claimed in claim 4, further comprising:

a block selecting circuit for outputting a block selecting signal;

a row decoder for selecting one of said plurality of word lines in accordance with a first address signal when said block selecting signal is at a predetermined level; a column decoder and a bit line detecting circuit for selecting one of said plurality of bit lines in accordance with a second address signal and a selecting signal.

6. A memory as claimed in claim 1, wherein said first group of memory cells and said second group of memory cells are accessed by a same address.

7. A memory comprising:

a plurality of word lines;

a plurality of bit lines; and a plurality of memory cells, wherein each of said memory cells corresponds to a selected one of said plurality of word lines and a selected one of said plurality of bit lines;

wherein said plurality of memory cells are divided into a first group of memory cells and a second group of memory cells, said first group of memory cells being provided for storing data and said second group of memory cells being provided for storing attribute data of said first group of memory cells, wherein said attribute data includes a number of rewriting of said first group of memory cells.

8. A memory as claimed in claim 7, wherein said first group of memory cells and said second group of memory cells are accessed by a same address.

9. A memory as claimed in claim 7, further comprising an error correction circuit connected to a plurality of word lines to detect and correct an error of at least one of said memory cells.

10. A memory as claimed in claim 7, further comprising an error correction circuit connected to a plurality of word lines to detect and correct an error of at least one of said plurality of bit lines.

11. A memory as claimed in claim 7, further comprising an erasing circuit to erase content data of at least one or more of said plurality of memory cells in response to an erasing signal.

12. A memory including a plurality of memory cell blocks, each of said plurality of memory cell blocks comprising:

a plurality of word lines;

a plurality of bit lines; and a plurality of memory cells, each of said plurality of memory cells being connected between one of said word lines and one of said bit lines;

wherein said plurality of memory cells are divided into a first group of memory cells and a second group of memory cells, wherein said first group of memory cells are provided for storing data and said second group of memory cells are provided for storing attribute data of said first group of memory cells, and wherein said first group of memory cells are memory cells storing 512 bits.

13. The memory as claimed in claim 12, further comprising an error correction circuit connected to said plurality of word lines to detect and correct an error of at least one of said plurality of memory cells connected to one of said word lines.

14. The memory as claimed in claim 12, further comprising an error correction circuit connected to said plurality of word lines to detect and correct an error of at least one of said plurality of bit lines connected to said word lines via corresponding memory cells.

15. The memory as claimed in claim 12, further comprising an erasing circuit to erase contents of said all memory cells of a selected one of said memory blocks, selected by an address signal in response to an erasing signal.

16. A memory as claimed in claim 15, further comprising:

a block selecting circuit for outputting a block selecting signal;

a row decoder for selecting one of said plurality of word lines in accordance with a first address signal when said block selecting signal is at a predetermined level;

a column decoder and a bit line detecting circuit for selecting one of said plurality of bit lines in accordance with a second address signal and a selecting signal.

17. A memory as claimed in claim 12, wherein at least one or more of said first group of memory cells and at least one or more of said second group of memory cells connected to a same word line are accessed by a same address.

18. A memory comprising:

a plurality of memory cell blocks further comprising;

a plurality of word lines;

a plurality of bit lines; and a plurality of memory cells, wherein each of said plurality of memory cells corresponds to a selected one of said word lines and a selected one of said bit lines; and wherein said plurality of memory cells are divided into a first group of memory cells and a second group of memory cells, said first group of memory cells provided for storing data and said second group of memory cells provided for storing attribute data of said first group of memory cells, and wherein said attribute data includes a rewriting number of said first group of memory cells.

19. A memory as claimed in claim 18, wherein at least one or more of said first group of memory cells and at least one or more of said second group of memory cells connected to a same word line are accessed by a same address.

20. A memory as claimed in claim 18, further comprising an error correction circuit connected to said plurality of word lines to detect and correct an error of at least one memory cell connected to one of said plurality of word lines.

21. A memory as claimed in claim 18, further comprising an error correction circuit connected to said plurality of word lines to detect and correct an error of at least one of said plurality of bit lines.

22. A memory as claimed in claim 18, further comprising an erasing circuit to erase contents of all of said memory cells of a selected one of said memory blocks, selected by an address signal in response to an erasing signal.

* * * * *